(12) United States Patent
Lin et al.

(10) Patent No.: US 7,489,574 B2
(45) Date of Patent: Feb. 10, 2009

(54) SENSING CIRCUIT FOR MEMORIES

(75) Inventors: Chun-Hung Lin, Hsinchu (TW); Yin-Chang Chen, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 54 days.

(21) Appl. No.: 11/763,900

(22) Filed: Jun. 15, 2007

(65) Prior Publication Data

US 2008/0310235 A1    Dec. 18, 2008

(51) Int. Cl.
*G11C 7/02* (2006.01)

(52) U.S. Cl. .............. 365/207; 365/185.2; 365/185.21; 365/210.1

(58) Field of Classification Search .............. 365/185.2, 365/185.21, 207, 210.1
See application file for complete search history.

(56) References Cited

U.S. PATENT DOCUMENTS

| | | | |
|---|---|---|---|
| 5,258,959 A | 11/1993 | Dallabora et al. | |
| 5,699,295 A | 12/1997 | Yero | |
| 6,075,726 A * | 6/2000 | Chen | 365/185.21 |
| 6,141,246 A * | 10/2000 | Derman et al. | 365/185.05 |
| 6,424,571 B1 * | 7/2002 | Pekny | 365/185.21 |
| 2006/0158946 A1 * | 7/2006 | Taddeo | 365/208 |

\* cited by examiner

*Primary Examiner*—Hoai V Ho
(74) *Attorney, Agent, or Firm*—J.C. Patents

(57) ABSTRACT

A memory apparatus includes a plurality of memory units, a sensing circuit and a bias-generating circuit. The plurality of memory units respectively outputs a data current to the sensing circuit, while the sensing circuit further includes a plurality of first transistors, a plurality of second transistors and a plurality of sensing amplifiers. In order to speed up the access time of the memory units, the bias-generating circuit rapidly provides a bias signal to the sensing circuit to turn on the first transistors of the sensing circuit. In the present invention, the sensing circuit uses a common reference voltage to reduce the circuit utilization area of the memory apparatus.

25 Claims, 4 Drawing Sheets

SENSING CIRCUIT FOR MEMORIES

BACKGROUND OF THE INVENTION

1. Field of the Invention

The present invention generally relates to a non-volatile memory (NVM), and more particularly, to a sensing circuit for NVM memories.

2. Description of Related Art

Currently, memories can be roughly categorized into a volatile memory (VM) and a non-volatile memory (NVM). A VM functions to save data only when the power source thereof is turned on; once the power source is turned off, the saved data in a VM is not kept anymore. Compared to VM however, an NVM functions to save data when the power source thereof is turned on, but also it is able to keep the data saved therein even after the power source is turned off. In addition, an NVM has advantages, such as fast access speed, high capacity density and compact volume. Thus, it can be used in various consumer electronic products, such as handset, digital camera, PDA (personal digital assistant) and the like.

A sensing amplifier is one of important devices in a memory chip. A driven sensing amplifier is not only able to read data in a memory unit, but also amplify the small read signal to speed up the read operation. Therefore, the speed of a sensing circuit for reading a memory unit and the area thereof are highly significant.

SUMMARY OF THE INVENTION

Accordingly, the present invention is directed to a sensing circuit for sensing the data saved in a memory unit.

The present invention is also directed to a memory apparatus having a common reference voltage to save the circuit area of the memory apparatus.

The present invention is also directed to a memory apparatus capable of quickly generating a bias signal to a sensing circuit.

As embodied and broadly described herein, the present invention provides a sensing circuit suitable for a memory apparatus and coupled to a memory unit. The sensing circuit includes a first transistor, a second transistor and a sensing amplifier, wherein the first source/drain terminal of the first transistor receives a data current output from the memory unit, the gate terminal thereof is coupled to a constant bias signal and the body terminal thereof is coupled to the first source/drain terminal of the first transistor; the gate terminal of the second transistor receives a reference signal, the second source/drain terminal thereof is grounded, and the gate terminal and the first source/drain terminal of the second transistor are respectively coupled to the positive input terminal and the negative input terminal of the sensing amplifier for sensing the data saved in the memory unit.

The present invention further provides a memory apparatus, which includes a plurality of memory units, a sensing circuit and a bias-generating circuit. The plurality of memory units respectively output a data current to the sensing circuit and the sensing circuit includes a plurality of first transistors, a plurality of second transistors and a plurality of sensing amplifiers, wherein the first source/drain terminals of the plurality of first transistors respectively receive a corresponding data current, the gate terminal of each the first transistors is coupled to a constant bias signal and the body terminal of each the first transistor is coupled to the first source/drain terminal thereof. The gate terminals of the plurality of second transistors receive a reference signal, the first source/drain terminal of each the second transistors is respectively coupled to the second source/drain terminal of a corresponding first transistor and the second source/drain terminal of each the second transistor is grounded. In addition, the gate terminal and the first source/drain terminal of each the second transistor are respectively coupled to the positive input terminal and the negative input terminal of a corresponding sensing amplifier to sense the data saved in a corresponding memory unit, while the bias-generating circuit generates a bias signal to turn on every first transistor in the sensing circuit.

Since the memory apparatus provided by the present invention employs a bias-generating circuit and is thereby able to quickly provide a bias signal to the sensing circuit so as to turn on the first transistor of the sensing circuit; therefore, accelerated the operation of reading data from the memory unit. In addition, the sensing circuit of the present invention has a common reference voltage, which reduces space utilization on the circuit area of the memory apparatus.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
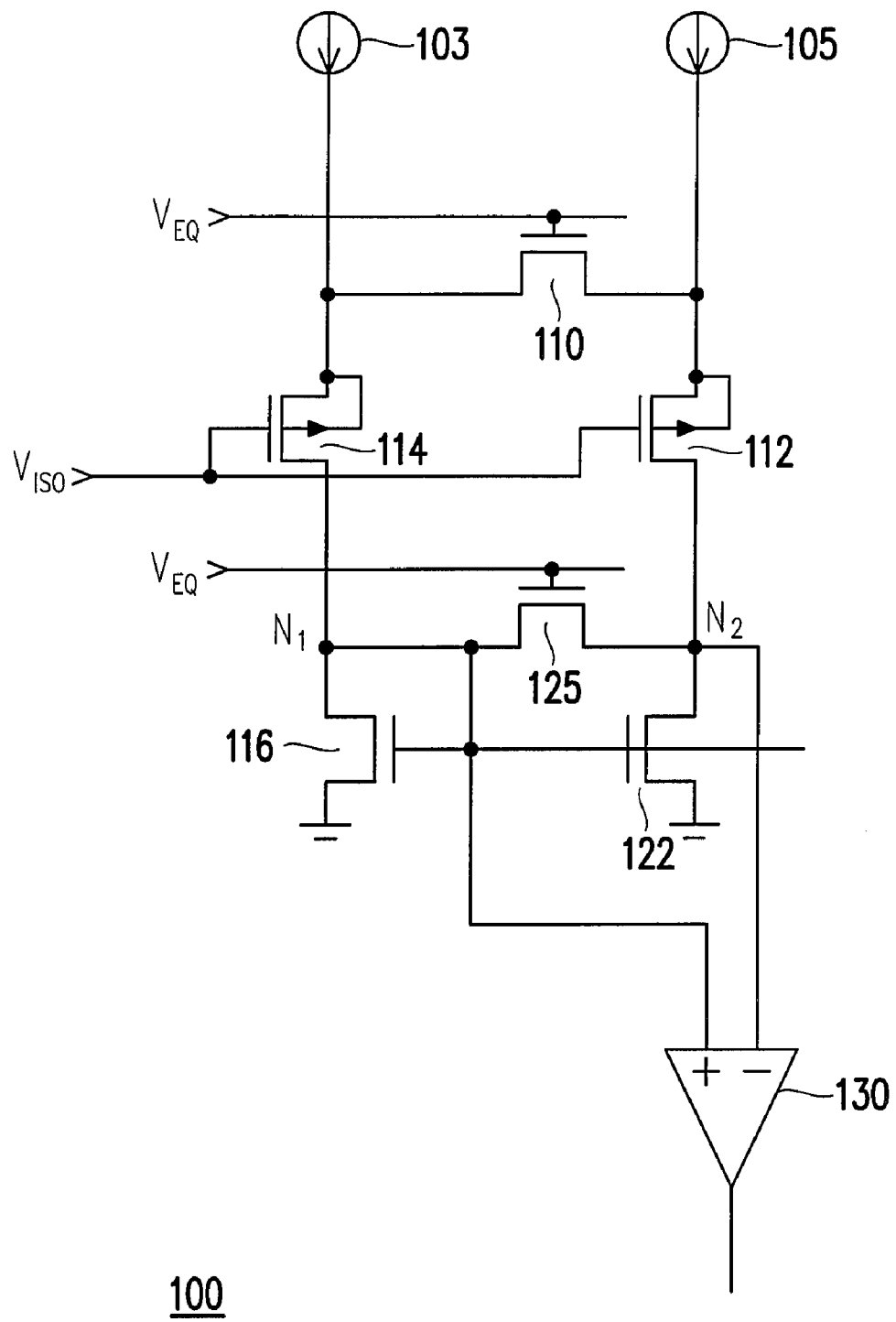
FIG. 1 is a diagram of a sensing circuit according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a sensing circuit according to an embodiment of the present invention. Referring to FIG. 1, a sensing circuit 100 provided by the present invention is suitable for a memory apparatus and coupled to a memory unit. The sensing circuit 100 includes transistors 112 and 122 and a sensing amplifier 130, wherein the first source/drain terminal of the transistor 112 receives a data current 105 from the memory unit, the gate terminal thereof is coupled to a constant bias signal $V_{ISO}$ and the body terminal thereof is coupled to the first source/drain terminal of the transistor 112. The gate terminal of the transistor 122 receives a reference signal and the second source/drain terminal thereof is grounded. In addition, the gate terminal and the first source/drain terminal of the transistor 122 are respectively coupled to the positive input terminal and the negative input terminal of the sensing amplifier 130 for sensing the data saved in the memory unit.

The sensing circuit 100 of the present invention further includes transistors 110, 114, 116 and 125, wherein the first source/drain terminal of the transistor 110 receives a reference current 103, the gate terminal thereof receives an equalization control signal $V_{EQ}$ and the second source/drain terminal thereof is coupled to the first source/drain terminal of the transistor 112; the first source/drain terminal of the transistor 114 and the body terminal thereof are coupled to each other and further coupled to the first source/drain terminal of the transistor 110, while the gate terminal of the transistor 114 receives the bias signal $V_{ISO}$.

According to the present invention, the body terminal of the transistor 114 can be coupled to a voltage source in addition to the first source/drain terminal of the transistor 114. Similarly, the body terminal of the transistor 112 can be coupled to the voltage source.

The first source/drain terminal and the second source/drain terminal of the transistor 125 are respectively coupled to the second source/drain terminal of the transistor 114 and the second source/drain terminal of the transistor 112, while the gate terminal of the transistor 125 receives the equalization control signal $V_{EQ}$.

Referring to FIG. 1, the first source/drain terminal and the gate terminal of the transistor 116 are respectively coupled to the second source/drain terminal of the transistor 114 and the gate terminal of the transistor 122 for converting the reference current 103 into a voltage reference signal to provide to the sensing amplifier 130 and the transistor 122, while the second source/drain terminal of the transistor 116 is grounded.

The transistors 112 and 114 of the present embodiment can be implemented by using PMOS transistors (P-type metal-oxide-semiconductor transistors), the transistors 122 and 116 can be implemented by using NMOS transistors (N-type metal-oxide-semiconductor transistors) and the transistors 110 and 125 can be implemented by using NMOS transistors or CMOS transistors (complementary metal oxide semiconductors).

Figure 2:
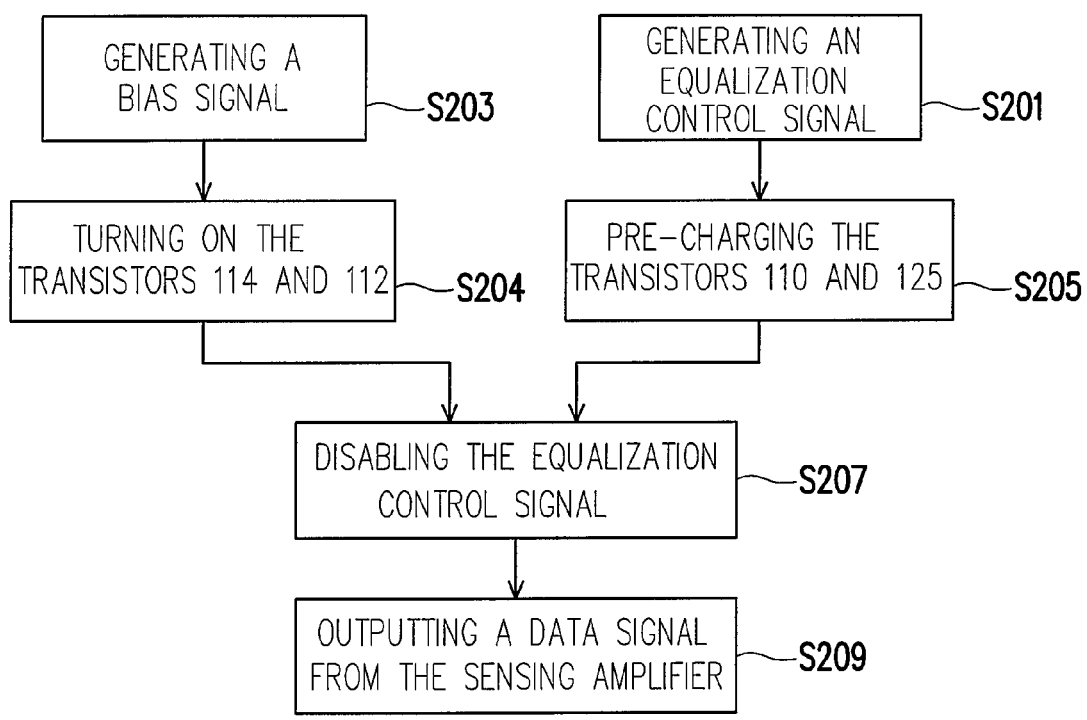
FIG. 2 is a flowchart of a sensing method of a sensing circuit according to an embodiment of the present invention.

FIG. 2 is a flowchart of a sensing method of a sensing circuit according to an embodiment of the present invention. Referring to FIGS. 1 and 2, the sensing method of the sensing circuit 100 in the embodiment includes steps S201 and S203, which respectively generate a equalization control signal $V_{EQ}$ and a bias signal $V_{ISO}$. The equalization control signal $V_{EQ}$ is sent to the gate terminals of the transistors 110 and 125 to turn on the transistors 110 and 125 (step S205); the bias signal $V_{ISO}$ is sent to the gate terminals of the transistors 112 and 114 to turn on the transistors 112 and 114. At the time, the first source/drain terminals and the second source/drain terminals of the transistors 110 and 125 would be quickly charged to a same level (step S204).

Next, as described in step S207, the equalization control signal $V_{EQ}$ is disabled, so as to turn off the transistors 110 and 125 while the reference current 103 and the data current 105 would respectively flow through the transistors 114 and 112. At a node N1, the reference current 103 produces a reference voltage sent to the positive input terminal of the sensing amplifier 130, while at a node N2, the data current, 105 produces a data voltage sent to the negative input terminal of the sensing amplifier 130. Further in step S209, the sensing amplifier 130 outputs a data saved in the memory unit. At this time, if the data voltage is higher than the reference voltage, the sensing amplifier 130 outputs a low-level data signal, which indicates the bit data saved in the memory unit is '0'; if the data voltage is lower than the reference voltage, the sensing amplifier 130 outputs a high-level data signal, which indicates the bit data saved in the memory unit is '1'.

Figure 3:
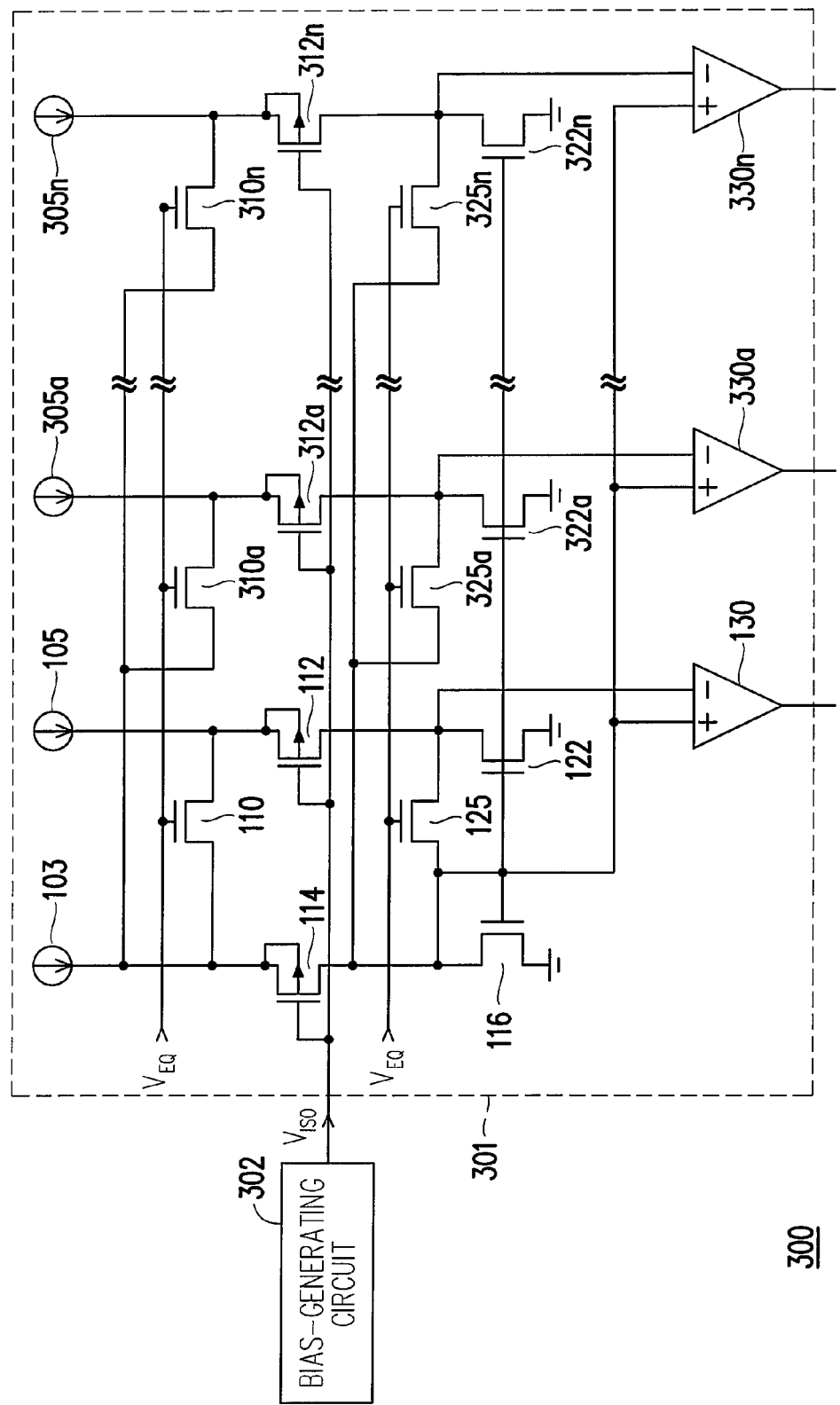
FIG. 3 is a diagram of a memory apparatus according to an embodiment of the present invention.

FIG. 3 is a diagram of a memory apparatus according to an embodiment of the present invention. Referring to FIG. 3, a memory apparatus 300 provided by the present invention includes a sensing circuit 301 and a bias-generating circuit 302, wherein the bias-generating circuit 302 generates a bias signal $V_{ISO}$ to turn on the PMOS transistors in the sensing circuit 301.

The sensing circuit 301 is suitable for the memory apparatus 300 and coupled to a plurality of memory units. The sensing circuit 301 includes transistors (112, 122, 312a-312n and 322a-322n) and a plurality of sensing amplifiers (130 and 330a-330n), wherein the first source/drain terminals of the transistors (112, 312a-312n) respectively receive a corresponding data current (105, 305a-305n), the gate terminals of the transistors (112, 312a-312n) receive a bias signal $V_{ISO}$ generated by the bias-generating circuit 302, and the body terminals and the first source/drain terminals of the transistors (112, 312a-312n) are coupled to each other. The gate terminals of the transistors (122, 322a-322n) receive a reference signal, the first source/drain terminals of the transistors (122, 322a-322n) are respectively coupled to the second source/drain terminals of the corresponding transistors (112, 312a-312n) and the second source/drain terminals of the transistors (122, 322a-322n) are grounded. In addition, the gate terminals and the first source/drain terminals of the transistors (122, 322a-322n) are respectively coupled to the positive input terminals and the negative input terminals of the corresponding sensing amplifiers (130, 330a-330n) to sense the data saved in the corresponding memory units.

In addition, the sensing circuit 301 of the present invention further includes a plurality of transistors (110, 114, 116, 125, 310a-310n and 325a-325n), wherein the first source/drain terminals of the transistors (110, 310a-310n) receive a reference current 103, the gate terminals thereof receive an equalization control signal $V_{EQ}$ and the second source/drain terminals thereof are respectively coupled to the first source/drain terminals of the corresponding transistors (112, 312a-312n). The first source/drain terminal and the body terminal of the transistor 114 are coupled to each other, and further coupled to the first source/drain terminals of the corresponding transistors (110, 310a-310n), while the gate terminal of the transistor 114 receives the bias signal $V_{ISO}$ generated by the bias-generating circuit 302. In addition, the first source/drain terminals of the transistors (125, 325a-325n) are coupled to the second source/drain terminal of the transistor 114, the second source/drain terminals of the transistors (125, 325a-325n) are coupled to the second source/drain terminals of the corresponding transistors (112, 312a-312n) and the gate terminals of the transistors (125, 325a-325n) receive the equalization control signal $V_{EQ}$.

According to the present invention, the body terminal of the transistor 114 can be coupled to a voltage source in addition to the first source/drain terminal of the transistor 114. Similarly, the body terminals of the transistor (112, 312a-312n) can be coupled to the voltage source.

Referring to FIG. 3, the first source/drain terminal and the gate terminal of the transistor 116 are respectively coupled to the second source/drain terminal of the transistor 114 and the gate terminals of the transistor (122, 322a-322n) for converting the reference current into a voltage reference signal and provide to the sensing amplifiers (130, 330a-330n) and the transistors (122, 322a-322n), while the second source/drain terminal of the transistor 116 is grounded.

The transistors (112, 114, 312a-312n) of the present embodiment can be implemented by using PMOS transistors, the transistors (122, 116, 322a-322n) can be implemented by using NMOS transistors and the transistors (110, 125, 310a-310n, 325a-325n) can be implemented by using NMOS transistors or CMOS transistors.

Those skilled in the art would be able to derive the operations of the sensing circuit 301 of the plurality of memory units in FIG. 3 according to the sensing circuit 100 for a single memory unit in FIG. 1 and the sensing method of a sensing circuit shown by FIG. 2, thus, detailed description thereof is omitted.

Figure 4:
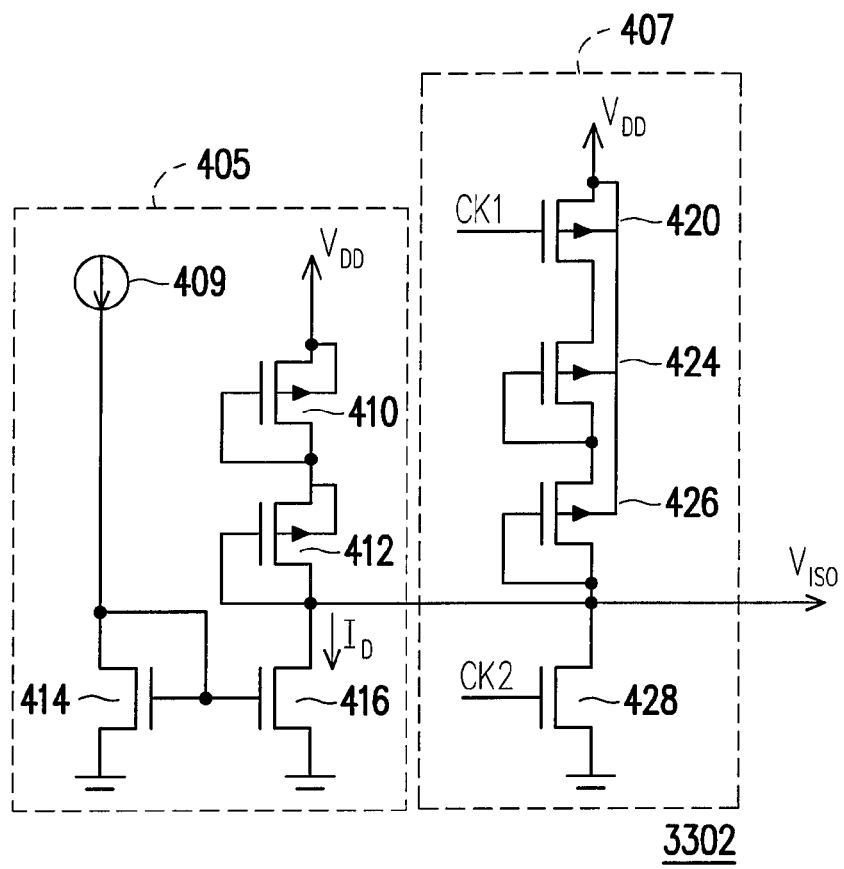
FIG. 4 is a diagram of a bias-generating circuit according to an embodiment of the present invention.

FIG. 4 is a diagram of a bias-generating circuit according to an embodiment of the present invention, which is an implementation of the bias-generating circuit 302 of FIG. 3. Referring to FIG. 4, a bias-generating circuit 3302 provided by the present invention includes a current mirror module 405 and a level-converting module 407, wherein the current mirror module 405 is employed for generating a bias signal $V_{ISO}$, and the level-converting module 407 is employed for shifting the level of the bias signal $V_{ISO}$ to a predetermined value to speed up stabling the level required by the bias signal $V_{ISO}$.

Besides, the current mirror module 405 further includes transistors 410, 412, 414 and 416, wherein the first source/drain terminal and the gate terminal of the transistor 414 are coupled to each other, and further coupled to a current source 409, and the second source/drain terminal of the transistor 414 is grounded. The first source/drain terminal and the body terminal of the transistor 410 are coupled to each other, and further coupled to a voltage source $V_{DD}$, while the gate terminal and the second source/drain terminal of the transistor 410 are coupled to each other. The first source/drain terminal and the body terminal of the transistor 412 are coupled to each other, and further coupled to the second source/drain terminal of the transistor 410, while the gate terminal and the second source/drain terminal of the transistor 412 are coupled to each other. In addition, the first source/drain terminal and the gate terminal of the transistor 416 are respectively coupled to the second source/drain terminal of the transistor 412 and the gate terminal of the transistor 414, while the second source/drain terminal of the transistor 416 is grounded.

In the current mirror module of the present embodiment, the transistor 414 can be implemented by using an NMOS transistor, and the transistors 410 and 412 can be implemented by using PMOS transistors.

Referring to FIG. 4, the level-converting module 407 of the present invention includes transistors 420, 424, 426 and 428, wherein the first source/drain terminal and the body terminal of the transistor 420 are coupled to each other, and further coupled to a voltage source $V_{DD}$, while the gate terminal of the transistor 420 receives a first clock signal CK1. The first source/drain terminal and the body terminal of the transistor 424 are respectively coupled to the second source/drain terminal and the body terminal of the transistor 420, while the gate terminal and the second source/drain terminal of the transistor 424 are coupled to each other. The first source/drain terminal and the body terminal of the transistor 426 are respectively coupled to the second source/drain terminal and the body terminal of the transistor 424, while the gate terminal and the second source/drain terminal of the transistor 426 are coupled to each other. In addition, the first source/drain terminal of the transistor 428 is coupled to the second source/drain terminal of the transistor 426, the gate terminal of the transistor 428 receives a second clock signal CK2, while the second source/drain terminal thereof is grounded.

In the level-converting module 407 of the present embodiment, the transistors 420, 424 and 426 can be implemented by using PMOS transistors, and the transistor 428 can be implemented by using an NMOS transistor.

Figure 5:
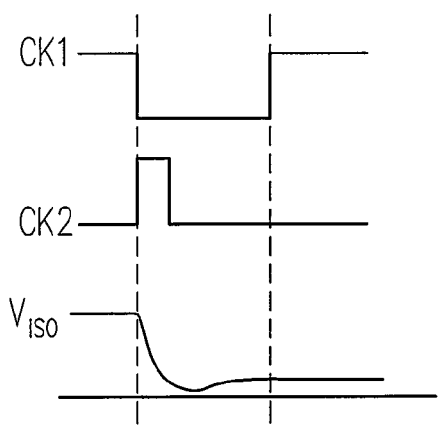
FIG. 5 is a timing diagram illustrating clock signals and a bias signal according to an embodiment of the present invention.

FIG. 5 is a timing diagram illustrating clock signals and a bias signal according to an embodiment of the present invention. Referring to FIGS. 3, 4 and 5, the transistors 414 and 416 of the current mirror module 405 form a current mirror, and while the current source 409 is input, a driving current ID to drive the transistor 416 is simultaneously produced. In the current mirror module 405 of the embodiment, the transistors 410 and 412 are connected in series, thus, the bias signal $V_{ISO}$ output from the current mirror is just the voltage source $V_{DD}$ minus the voltage drop across the two transistors. In addition, the amount of the bias signal $V_{ISO}$ can be controlled by changing the number of the transistors.

The bias signal $V_{ISO}$ in the present invention is sent to the first source/drain terminal of the transistor 428; at the time, if the first clock signal CK1 and the second clock signal CK2 are input, the transistors 420 and 428 would be turned on. Since the driving capability of the transistor 428 is more powerful than that of the transistor 420, the bias signal $V_{ISO}$ would be quickly dropped down to a low-level, following by shutting off the second clock signal CK2. Compared to the transistors 410 and 412, the wiring of the transistors 424 and 426 more likely causes a body effect, which is able to quickly charge the bias signal $V_{ISO}$ to a required level or so. After that, the first clock signal CK1 is shut off, so that the bias signal $V_{ISO}$ can be more quickly stabled to the required level. At this time, the bias signal $V_{ISO}$ is sent to the sensing circuit 301, meanwhile, all of the PMOS transistors (112, 114, 312a-312n) of the sensing circuit 301 are turned on. The bias signal $V_{ISO}$ and the data signal are also respectively input to the positive input terminals and the negative input terminals of the sensing amplifiers (130, 330a-330n) to output the data saved in the memory units.

In summary, the memory apparatus of the present invention includes a plurality of memory units, a sensing circuit and a bias-generating circuit, wherein the bias-generating circuit is able to quickly provide the sensing circuit with the required bias signal to turn on the PMOS transistors in the sensing circuit. In addition, since the sensing circuit of the present invention adopts a common reference voltage, the space utilization area of the memory apparatus is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sensing circuit, suitable for a memory apparatus and coupled to a memory unit; comprising:
   a first transistor, comprising a first source/drain terminal for receiving a data current output from the memory unit, a gate terminal coupled to a constant bias signal and a body terminal coupled to the first source/drain terminal;
   a second transistor, comprising a first source/drain terminal coupled to the second source/drain terminal of the first transistor, a gate terminal for receiving a reference signal and a second source/drain terminal grounded; and
   a sensing amplifier, comprising a positive input terminal and a negative input terminal, wherein the positive input terminal is coupled to the gate terminal and the first source/drain terminal of the second transistor to sense a data saved in the memory unit.

2. The sensing circuit according to claim 1, wherein the first transistor is a PMOS transistor.

3. The sensing circuit according to claim 1, wherein the second transistor is an NMOS transistor.

4. The sensing circuit according to claim 1, wherein the first source/drain terminal of the first transistor receives a data current output from the memory unit, the gate terminal thereof is coupled to a constant bias signal and the body terminal thereof is coupled to a voltage source.

5. The sensing circuit according to claim 1, further comprising:
- a third transistor, comprising a first source/drain terminal for receiving a reference current, a gate terminal for receiving an equalization control signal and a second source/drain terminal coupled to the first source/drain terminal of the first transistor;
- a fourth transistor, comprising a first source/drain terminal and a body terminal coupled to the first source/drain terminal thereof, and further to the first source/drain terminal of the third transistor, wherein the gate terminal of the fourth transistor receives the bias signal;
- a fifth transistor, comprising a first source/drain terminal and a second source/drain terminal respectively coupled to the second source/drain terminal of the fourth transistor and the second source/drain terminal of the first transistor, wherein the gate terminal of the fifth transistor receives the equalization control signal; and
- a sixth transistor, comprising a first source/drain terminal and a gate terminal respectively coupled to the second source/drain terminal of the fourth transistor and the gate terminal of the second transistor to convert the reference current into a voltage reference signal and to provide the sensing amplifier and the second transistor with the voltage reference signal, wherein a second source/drain terminal of the sixth transistor is grounded.

6. The sensing circuit according to claim 5, wherein the third transistor, the fifth transistor and the sixth transistor are NMOS transistors.

7. The sensing circuit according to claim 5, wherein the third transistor and the fifth transistor are CMOS transistors.

8. The sensing circuit according to claim 5, wherein the fourth transistor is a PMOS transistor.

9. The sensing circuit according to claim 5, wherein the first source/drain terminal of the fourth transistor receives a reference current, the gate terminal thereof is coupled to a constant bias voltage and the body terminal thereof is coupled to the voltage source.

10. A memory apparatus, comprising:
- a plurality of memory units, respectively outputting a data current;
- a sensing circuit, comprising:
  - a plurality of first transistors, each first transistor comprising a first source/drain terminal for receiving a corresponding data current, a gate terminals coupled to a constant bias signal and a body terminal coupled to the first source/drain thereof;
  - a plurality of second transistors, each second transistor comprising a first source/drain terminal respectively coupled to the second source/drain terminal of a corresponding first transistor, a gate terminal for receiving a reference signal and a second source/drain terminal grounded; and
- a plurality of sensing amplifiers, each sensing amplifier comprising a positive input terminal and a negative input terminal, wherein the positive input terminal is coupled to the first source/drain terminal and the gate terminal of a corresponding second transistor to sense a data saved in the memory unit; and
- a bias-generating circuit, for generating the constant bias signal and transmitting to the first transistors.

11. The memory apparatus according to claim 10, wherein the first transistors are PMOS transistors.

12. The memory apparatus according to claim 10, wherein the second transistors are NMOS transistors.

13. The memory apparatus according to claim 10, wherein the first source/drain terminal of each the first transistor respectively receives a corresponding data current, the gate terminal thereof is coupled to a constant bias signal and the body terminal thereof is coupled to a voltage source.

14. The memory apparatus according to claim 10, wherein the sensing circuit further comprises:
- a plurality of third transistors, comprising a first source/drain terminal for receiving a reference current, a gate terminal for receiving an equalization control signal and a second source/drain terminal respectively coupled to the first source/drain terminal of a corresponding first transistor;
- a fourth transistor, comprising a first source/drain terminal and a body terminal coupled to the first source/drain terminal thereof, and further to the first source/drain terminal of a corresponding third transistor, wherein a gate terminal of the fourth transistor receives the bias signal;
- a plurality of fifth transistors, each fifth transistor comprising a first source/drain terminal and a second source/drain terminal respectively coupled to the second source/drain terminal of the fourth transistor and the second source/drain terminal of a corresponding first transistor, wherein a gate terminal of each fifth transistor receives the equalization control signal; and
- a sixth transistor, comprising a first source/drain terminal and a gate terminal respectively coupled to the second source/drain terminal of the fourth transistor and the gate terminals of the second transistors to convert the reference current into a voltage reference signal and provide the sensing circuit and the second transistors with the voltage reference signal, wherein a second source/drain terminal of the sixth transistor is grounded.

15. The memory apparatus according to claim 14, wherein the third transistors, the fifth transistors and the sixth transistor are NMOS transistors.

16. The memory apparatus according to claim 14, wherein the third transistors and the fifth transistors are CMOS transistors.

17. The memory apparatus according to claim 14, wherein the fourth transistor is a PMOS transistor.

18. The memory apparatus according to claim 14, wherein the first source/drain terminal of the fourth transistor receives a reference current, the gate terminals thereof is coupled to a constant bias voltage and the body terminal thereof is coupled to the voltage source.

19. The memory apparatus according to claim 10, wherein the bias-generating circuit comprises:
- a current mirror module, for generating the bias signal; and
- a level-converting module, for shifting a level of the bias signal to a predetermined value.

20. The memory apparatus according to claim 19, wherein the current mirror module comprises:
- a seventh transistor, comprising a first source/drain terminal and a gate terminal coupled to the first source/drain terminal thereof and a current source, wherein a second source/drain terminal of the seventh transistor is grounded;
- at least an eighth transistor, comprising a first source/drain terminal and a body terminal coupled to the first source/drain terminal thereof and a voltage source, wherein a gate terminal and a second source/drain terminal of the eighth transistor are coupled to each other; and
- a ninth transistor, comprising a first source/drain terminal and a gate terminal respectively coupled to the second source/drain terminal of the eighth transistor and the gate terminal of the seventh transistor, wherein a second source/drain terminal of the ninth transistor is grounded.

21. The memory apparatus according to claim 20, wherein the seventh transistor and the ninth transistor are NMOS transistors.

22. The memory apparatus according to claim 20, wherein the eighth transistor is a PMOS transistor.

23. The memory apparatus according to claim 19, wherein the level-converting module comprises:
- a tenth transistor, comprising a first source/drain terminal and a body terminal coupled to the first source/drain terminal thereof and a voltage source, wherein a gate terminal of the tenth transistor receives a first clock signal;
- at least an eleventh transistor, comprising a first source/drain terminal and a body terminal respectively coupled to the second source/drain terminal and the body terminal of the tenth transistor, and a gate terminal and a second source/drain terminal of the eleventh transistor are coupled to each other; and
- a twelfth transistor, comprising a first source/drain terminal coupled to the second source/drain terminal of the eleventh transistor, a gate terminal for receiving a second clock signal, and a second source/drain terminal is grounded.

24. The memory apparatus according to claim 23, wherein the tenth transistor and the eleventh transistor are PMOS transistors.

25. The memory apparatus according to claim 23, wherein the twelfth transistor is an NMOS transistor.

* * * * *